US012663671B2

(12) United States Patent
Yang et al.

(10) Patent No.: US 12,663,671 B2
(45) Date of Patent: Jun. 23, 2026

(54) DISPLAY DEVICE COMPRISING COVER WINDOW INCLUDING DENSITY CONTROL AREA

(71) Applicant: LG DISPLAY CO., LTD., Seoul (KR)

(72) Inventors: Seung-Soo Yang, Paju-si (KR);
Sun-Woong Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 590 days.

(21) Appl. No.: 17/973,231

(22) Filed: Oct. 25, 2022

(65) Prior Publication Data

US 2023/0180517 A1     Jun. 8, 2023

(30) Foreign Application Priority Data

Dec. 7, 2021     (KR) ........................ 10-2021-0173637

(51) Int. Cl.
| | |
|---|---|
| *G02F 1/1333* | (2006.01) |
| *H10K 50/84* | (2023.01) |
| *H10K 50/858* | (2023.01) |
| *H10K 50/86* | (2023.01) |
| *H10K 59/35* | (2023.01) |

(52) U.S. Cl.
CPC ....... *G02F 1/133331* (2021.01); *H10K 50/84* (2023.02); *H10K 50/858* (2023.02); *H10K 50/865* (2023.02); *H10K 59/353* (2023.02)

(58) Field of Classification Search
None
See application file for complete search history.

(56) References Cited

U.S. PATENT DOCUMENTS

| | | | | | |
|---|---|---|---|---|---|
| 2008/0310019 A1* | 12/2008 | Um | ........................ | G02B 1/111 | 359/580 |
| 2019/0094420 A1* | 3/2019 | Choi | ...................... | G02B 1/118 | |
| 2019/0119154 A1* | 4/2019 | Navet | ..................... | C03C 3/087 | |

FOREIGN PATENT DOCUMENTS

| | | |
|---|---|---|
| CN | 109641790 A | 4/2019 |
| JP | 2015-011162 A | 1/2015 |
| KR | 20080110090 A | 12/2008 |
| KR | 10-2013-0052108 A | 5/2013 |
| KR | 10-1707392 B1 | 2/2017 |
| KR | 10-2017-0119799 A | 10/2017 |
| KR | 10-2019-0116903 A | 10/2019 |
| KR | 10-2078990 B1 | 2/2020 |

OTHER PUBLICATIONS

Korean Office Action dated Nov. 19, 2024 issued in Patent Application No. 10-2021-0173637 (4 pages).
Office Action in Korean Appln. No. 10-2021-0173637, mailed on Sep. 24, 2025, 9 pages (with English translation).
Office Action in Chinese Appln. No. 202211549024.3, mailed on Nov. 27, 2025, 15 pages (with English translation).

* cited by examiner

*Primary Examiner* — Daniel Whalen
(74) *Attorney, Agent, or Firm* — Fish & Richardson P.C.

(57) ABSTRACT

A display device includes a display panel and a cover window including a density control area and being located corresponding to a transmission direction of a light emitted from the display panel, a refractive index of the density control area being gradually changed, wherein the refractive index of the density control area is gradually changed through voids.

14 Claims, 10 Drawing Sheets

200a

DISPLAY DEVICE COMPRISING COVER WINDOW INCLUDING DENSITY CONTROL AREA

CROSS REFERENCE TO RELATED APPLICATION

The present application claims the priority of Korean Patent Application No. 10-2021-0173637 filed on Dec. 7, 2021, which is hereby incorporated by reference in its entirety for all purposes as if fully set forth herein.

BACKGROUND

Field of the Disclosure

The present disclosure relates to a display device, and more particularly, to a display device which is capable of realizing an image of excellent color by preventing a displayed image from being modulated by reflection of an external light.

Description of the Background

In line with an information age, a display field has have been developed rapidly, and in response to this, a liquid crystal display device (LCD), an organic light emitting display device (OLED) or the like as a flat panel display device (FPD) with the advantages of thin profile, light weight and low power consumption has been developed and widely applied.

Meanwhile, in the display device, it is difficult to see a display screen due to reasons such as a surrounding object or scenery being reflected on the screen by a surface reflection of an external light. Such the surface reflection occurs more frequently as the display screen becomes larger and surroundings are brighter.

When the surface reflection is severe, the display screen is covered, and a user who is watching it cannot see an image well, which causes great inconvenience.

In order to solve this problem, a polarizing plate and a retardation plate are arranged on a display panel to suppress a surface reflection caused by an external light (hereinafter, referred to as an external light reflection). However, recently, as display devices are widely used outdoors as portable display devices such as smart phones and tablet PCs, there is an urgent need for research to improve display characteristics for an external light reflection.

Accordingly, an anti-reflection film is further included, and the anti-reflection film is largely divided into an AG (Anti-Glare) type film and an AR (Anti-Reflection) type film.

The AG type film prevents a regular reflection by forming a fine concavo-convex structure at a surface to cause refraction and scattering of light. To do this, the fine concavo-convex structure is formed by coating fine particles of several tens to hundreds of micrometers and a mixture of a binder resin and a curing agent resin on a base film to form a separate surface treatment layer.

The AG type anti-reflection film has an advantage of being relatively easy to process. However, as it causes haze, in the case of fine pixels, an image quality may be rather deteriorated depending on a size of the particles used.

Therefore, there are cases where the AG-type anti-reflection film is not suitable for use in display devices most widely used recently among display devices, and in particular, recently, even a small-sized display device has been adopted with a high resolution. Thus it is more difficult to apply the AG-type film.

Meanwhile, the AR-type anti-reflection film lowers a reflectance at a surface by using the interference effect through a change of wavelength and intensity of light according to refractive index and thickness of a medium.

To this end, the AR type film has a stacked structure of several layers (e.g., 2 layer to 5 layers) having different refractive indices. The stacked structure can be formed by using a method, such as bonding of coated films, direct deposition, sputtering, ion plating, ion beam deposition or the like, or a method, such as a gravure coating, micro-gravure coating, roll coating, bar coating, dip coating or the like of a paint for each layer.

The AR type anti-reflection films have problems in that a loss in stacking process is large, a mass productivity is lowered due to many steps and a price is high.

SUMMARY

Accordingly, the present disclosure is directed to a display device that substantially obviates one or more of the problems due to limitations and disadvantages described above.

More specifically, the present disclosure is to provide a display device which includes a cover glass that can have a simple process, be inexpensive and suppress an external light reflection.

In addition, the present disclosure is to provide a light emitting diode display which can improve a display characteristic such as visibility by suppressing an external light reflection.

Additional features and advantages of the disclosure will be set forth in the description which follows, and in part will be apparent from the description, or may be learned by practice of the disclosure. These and other advantages of the disclosure will be realized and attained by the structure particularly pointed out in the written description and claims hereof as well as the appended drawings.

To achieve these and other advantages and in accordance with the purpose of the present disclosure, as embodied and broadly described herein, a display device includes: a display panel; and a cover window including a density control area and being located corresponding to a transmission direction of a light emitted from the display panel, a refractive index of the density control area being gradually changed, wherein the refractive index of the density control area is gradually changed through voids.

It is to be understood that both the foregoing general description and the following detailed description are exemplary and explanatory and are intended to provide further explanation of the disclosure as claimed.

BRIEF DESCRIPTION OF THE DRAWINGS

The accompanying drawings, which are included to provide a further understanding of the disclosure and are incorporated in and constitute a part of this specification, illustrate aspects of the disclosure and together with the description serve to explain the principles of the disclosure. In the drawings.

DETAILED DESCRIPTION OF THE ILLUSTRATED ASPECTS

Hereinafter, an aspect according to the present disclosure is explained with reference to the drawings.

Figure 1:
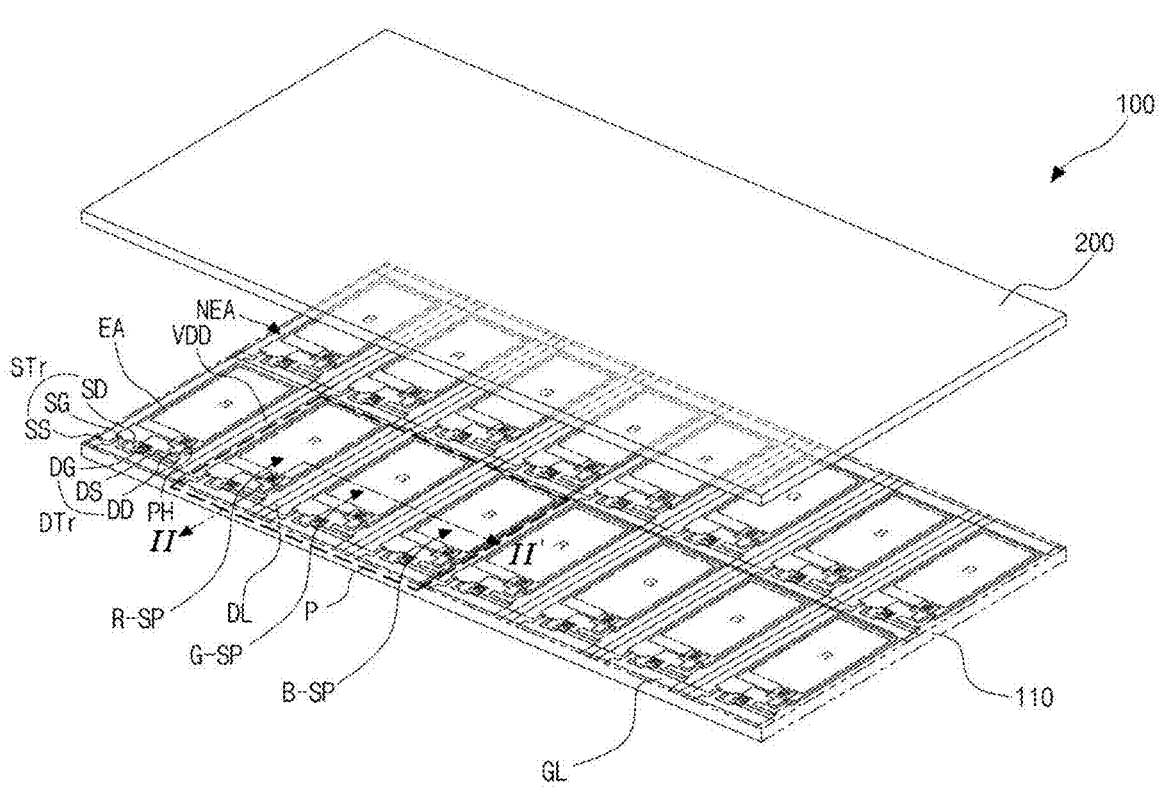
FIG. 1 is a schematic diagram illustrating a plurality of sub-pixels in a display device according to an aspect of the present disclosure.

FIG. 1 is a schematic diagram illustrating a plurality of sub-pixels in a display device according to an aspect of the present disclosure.

As shown in FIG. 1, the display device 100 according to the aspect of the present disclosure may include a display panel 110 and a cover window (or cover glass) 200.

At this time, a direction in the drawing is defined for convenience of explanations as follows: on the premise that a display surface of the display panel 110 faces forward, the cover window 200 is disposed in front of the display panel 110.

In more detail, the display panel 110 may be a display panel of a liquid crystal display device (LCD), a plasma display panel device (PDP), a field emission display device (FED), an electroluminescence display device (ELD), or an organic light emitting diode display device (OLED).

Hereinafter, for convenience of explanations, the display device 100 in which a light is emitted by an energy generated when excitons generated by combining electrons and holes in a light emitting layer fall from an excited state to a ground state is described by way of example.

In the display panel 110, one unit pixel P may be defined to include red, green and blue sub-pixels R-SP, G-SP and B-SP. Each of the sub-pixels R-SP, G-SP and B-SP may include an emission area EA, and a bank (119 of FIG. 5) may be disposed along an edge of the emission area EA to form a non-emission area NEA.

In this case, the red, green and blue sub-pixels R-SP, G-SP and B-SP may be alternately disposed in a horizontal direction, which is a row direction, and each of a plurality of red, green and blue sub-pixels R-SP, G-SP and B-SP may be arranged in a vertical direction.

Accordingly, each of the red, green and blue sub-pixels R-SP, G-SP and B-SP may have a structure arranged in a stripe shape.

Here, for convenience of explanations, the red, green and blue sub-pixels R-SP, G-SP and B-SP are illustrated as being positioned side by side with the same width, but the red, green and blue sub-pixels R-SP, G-SP and B-SP may have various structures with different widths.

At this time, switching and driving thin film transistors STr and DTr may be provided on the non-emission area NEA of each of the sub-pixels R-SP, G-SP and B-SP. A light emitting diode (ED of FIG. 5) including a first electrode (111 of FIG. 5), a light emitting layer (113 of FIG. 5) and a second electrode (115 of FIG. 5) may be located on the emission area EA of each of the sub-pixels R-SP, G-SP and B-SP.

Figure 5:
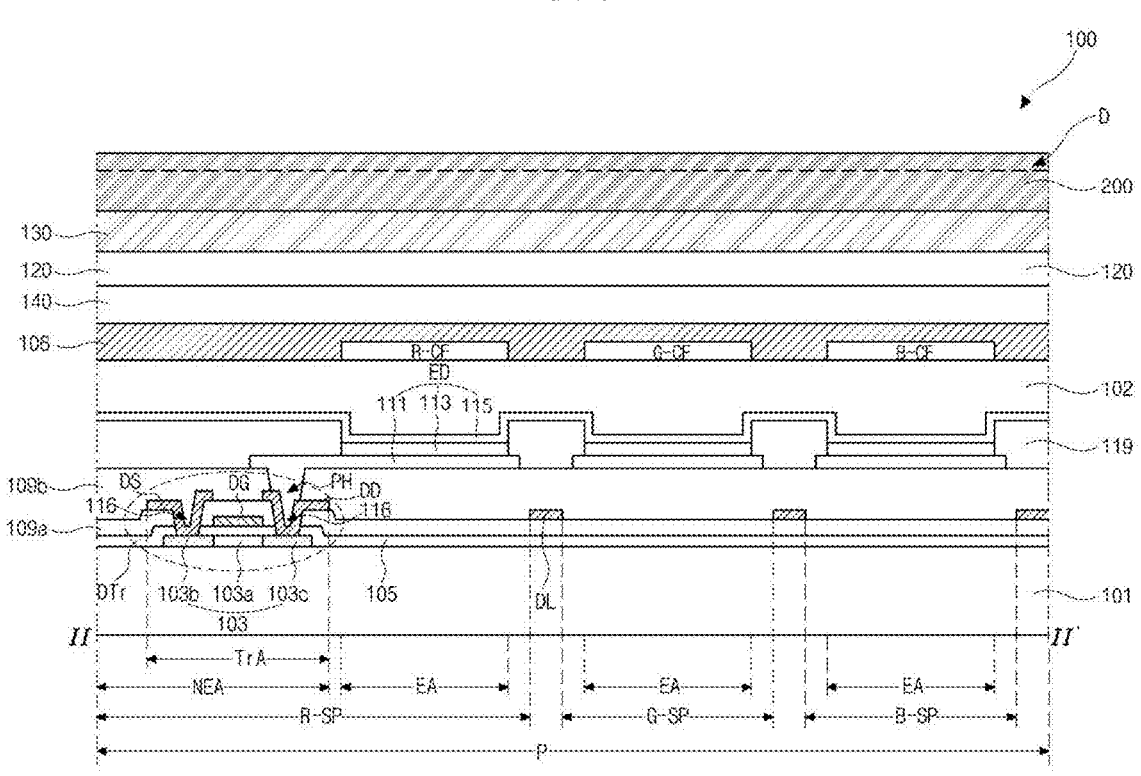
FIG. 5 is a cross-sectional view, taken along line II-II' of FIG. 1, illustrating a structure of a unit pixel including three sub-pixels according to an aspect of the present disclosure.

Here, the switching thin film transistor STr and the driving thin film transistor DTr may be connected to each other, and the driving thin film transistor DTr may be connected to the light emitting diode (ED of FIG. 5).

In more detail, a gate line GL, a data line DL and a power line VDD may be disposed on the substrate 101 to define each of the sub-pixels R-SP, G-SP and B-SP.

The switching thin film transistor STr may be formed in an intersection region of the gate line GL and the data line DL, and the switching thin film transistor STr may serve to select each of the sub-pixels R-SP, G-SP and B-SP.

The switching thin film transistor STr may include a gate electrode SG branching from the gate line GL, a semiconductor layer (not shown), a source electrode SS, and a drain electrode SD.

In addition, the driving thin film transistor DTr may serve to drive the light emitting diode (ED of FIG. 5) of each of the sub-pixels R-SP, G-SP and B-SP selected by the switching thin film transistor STr. The driving thin film transistor DTr may include a gate electrode DG connected to the drain electrode SD of the switching thin film transistor STr, a semiconductor layer (103 of FIG. 5), a source electrode DS connected to the power line VDD, and a drain electrode DD.

The drain electrode DD of the driving thin film transistor DTr may be connected to the first electrode (111 of FIG. 5) of the light emitting diode (ED of FIG. 5).

The light emitting layer (113 of FIG. 5) may be interposed between the first electrode (111 of FIG. 5) and the second electrode (115 of FIG. 5) of the light emitting diode (ED of FIG. 5).

In addition, the cover window 200 may be positioned on the front surface (for example, an image display surface) of the display panel 110 to correspond to a transmission direction of a light emitted through the light emitting layer (113 of FIG. 5). The cover window 200 according to the aspect of the present disclosure may cause a gradual change in refractive index of an incident light to prevent a sudden change in refractive index of a medium, which is a basic condition for reflection, thereby preventing a reflection.

Accordingly, the display device 100 according to the aspect of the present disclosure can minimize a reflectance of an external light, thereby improving a display characteristics.

Figure 2A:
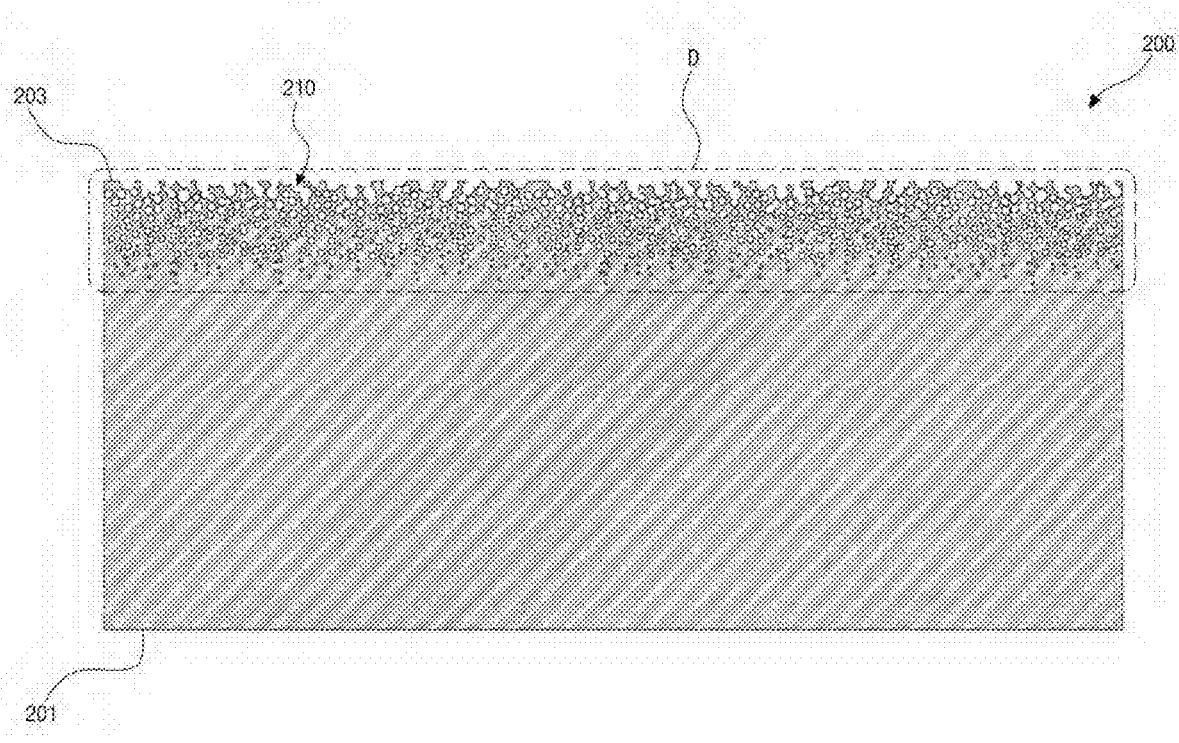
FIG. 2A is a cross-sectional view schematically illustrating a cover window according to an aspect of the present disclosure.
Figure 2B:
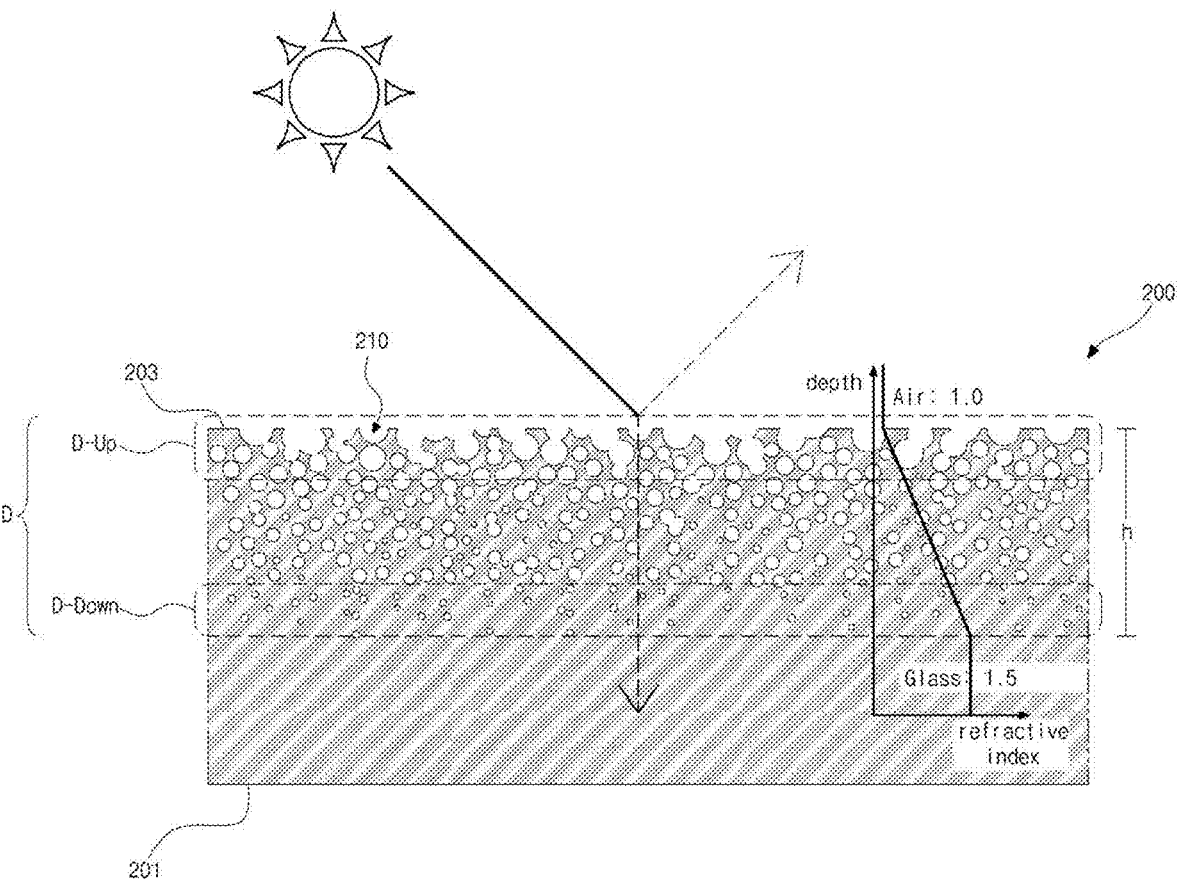
FIG. 2B is a schematic view for explaining an anti-reflection principle of a cover window according to an aspect of the present disclosure.

FIG. 2A is a cross-sectional view schematically illustrating a cover window according to an aspect of the present disclosure, and FIG. 2B is a schematic view for explaining an anti-reflection principle of a cover window according to an aspect of the present disclosure.

Figure 3A:
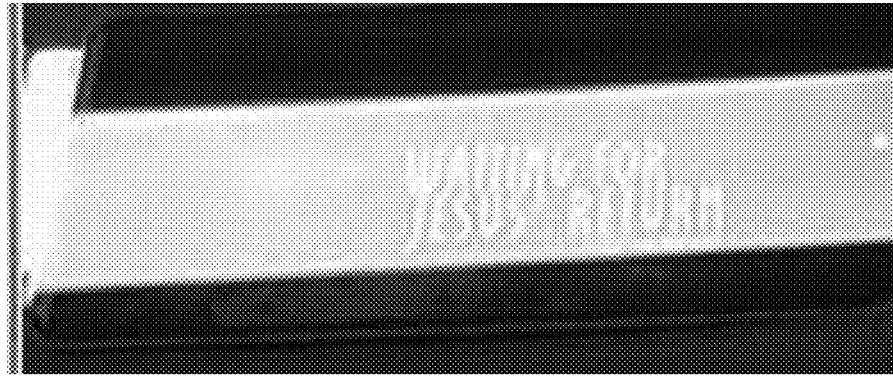
FIG. 3A is a photograph illustrating a visibility of a conventional display device.
Figure 3B:
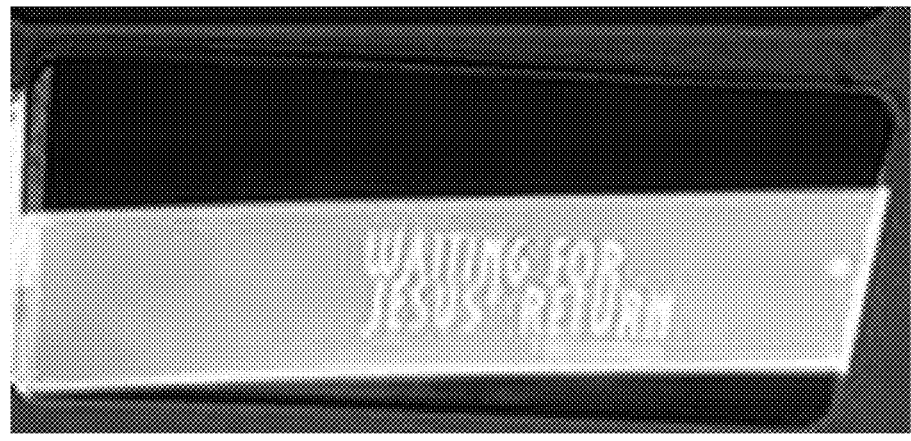
FIG. 3B is a photograph illustrating a display device including a cover glass according to an aspect of the present disclosure.

FIG. 3A is a picture showing a visibility of a conventional display device, and FIG. 3B is a picture showing a visibility of a display device including a cover window according to an aspect of the present disclosure.

As shown in FIG. 2A, the cover glass 200 according to the aspect of the present disclosure may serve to protect the display panel (110 in FIG. 1). The cover window 200 may protect the display panel (110 in FIG. 1) from an external impact, and may transmit a light emitted from the display panel (110 in FIG. 1) so that an image displayed on the display panel (110 in FIG. 1) is seen to the outside.

The cover window 200 may be made of any one of a sapphire glass, a tempered glass and a soda lime glass substrate having an impact resistance and a light transmittance. The cover window 200 according to the aspect of the present disclosure may be characterized in that a density control area D including voids 210 is provided.

In other words, the cover window 200 according to the aspect of the present disclosure may be made of a glass substrate having a certain thickness, and one surface facing the light emitting layer (shown as 113 of FIG. 5) is defined as a bottom surface (or lower surface) 201, and the density control area D is provided at a side opposite to the bottom surface 201 and has a predetermined thickness from a top surface (or upper surface) 203 exposed to the outside.

The density control area D may include the plurality of voids 210, and the plurality of voids 210 may decrease in size or in number per unit area from the top surface 203 toward the bottom surface 201 of the cover window 200, thereby causing a refractive index difference in the density control area D.

In more detail, in an upper side (or upper portion) D-Up of the density control area D corresponding to a surface side of the top surface 203 of the cover window 200, the voids 210 may increase in size or in number per unit area, and thus a density of the cover window 200 itself may be low. In addition, in a lower side (or lower portion) D-Down of the density control area D facing the bottom surface 201 of the cover window 200, the voids 210 may have a smaller size or less number per unit area than that of the voids in the upper side D-Up. As such, in the density control area D, as the density of the cover window 200 itself varies depending on the size and/or number of voids 210, a difference in refractive index may occur.

Accordingly, in the cover window 200, the upper side D-Up of the density control area D has a low refractive index as the density of the cover window 200 itself is formed low, and the lower side D-Down of the density control area D has a higher refractive index as the density of the cover window 200 itself is formed higher than that of the upper side D-Up.

At this time, as the size and/or number of the voids 210 per unit area gradually increase from the lower side D-Down to the upper side D-Up of the density control area D, the refractive index of the density control area D gradually decreases from the lower side D-Down to the upper side D-Up.

According to the aspect of the present disclosure, the density control area D provided in the cover window 200 may be defined as a region causing a gradual change in refractive index. The refractive index gradually decreases from the lower side D-Down to the upper side D-Up of the density control area D. For example, the lower side D-Down has a refractive index similar to that of a glass forming the cover window 200. For example, a difference between the refractive index of the lower side D-Down and the refractive index of the glass forming the cover window 200 is equal to or less than a first predetermined threshold which may be 0.1.

Here, the refractive index of the cover glass 200 made of a glass substrate may be 1.4 to 1.6. The lower side D-Down of the density control area D may have a refractive index of 1.4 to 1.6, and the upper side D-Up of the density control area D may have a refractive index of 1.0 to 1.1.

Accordingly, the upper side D-Up of the density control area D of the cover glass 200 may have a refractive index similar to that of an air layer (an example of a medium) outside the cover glass 200. For example, a difference between the refractive index of the upper side D-Up and the refractive index of the air layer is equal to or less than a second predetermined threshold which may be 0.1. As such, when the upper side D-Up of the density control area D has a refractive index similar to that of the air layer outside the cover glass 200, a boundary between the cover glass 200, and the air layer becomes optically ambiguous, so that a light may not be refracted at the boundary between the cover glass 200 and the air layer. Accordingly, a visibility due to a refraction of light does not occur at the boundary between the cover glass 200 and the air layer.

As shown in FIG. 2B, as the boundary between the cover glass 200 and the air layer becomes optically ambiguous, a total reflection due to the difference in refractive index between the two media does not occur, and an incident light incident from the outside at all azimuth angles may be incident into the display panel (shown as 110 of FIG. 1) as it is. Therefore, a reflected light by an external light is not generated.

It has the same effect as the case where the reflected light disappears because the user cannot see the surface reflected light, and through this, the external light reflectance can be reduced.

By reducing the external light reflectance, a deterioration of visibility due to the external light can be prevented. In addition, it is possible to prevent a problem in that a display characteristics is deteriorated due to reduction in luminance and contrast ratio.

Table 1 below is an experimental result of measuring an external light reflectance according to presence or absence of the density control area D, and the external light reflectance was measured from the front of the display panel (shown as 110 of FIG. 1) to which the cover window 200 is attached. At this time, incident azimuth and illuminance of external light were designed and measured in the same way.

TABLE 1

|  | Sample 1 | Sample 2 |
| --- | --- | --- |
| External light reflectance | 5.06% | 1.8% |

In Table 1, Sample 1 indicates a display device to which a cover window without a density control area i.e., a conventional cover window is attached, and Sample 2 indicates the display device (shown as 100 of FIG. 1) to which the cover window 200 provided with the density control area D, in particular, the density control area D causing a gradual change in refractive index according to the aspect of the present disclosure is attached.

Referring to Table 1, in Sample 1, the reflectance of external light reflected from the cover glass to the outside is 5%, and in this case, a visibility of a display screen implemented in the display device is very low.

On the other hand, Sample 2 has a reflectance of 1.8%, and it can be seen that the external light reflectance is reduced by 64% compared to Sample 1. When a reflectance is less than 3%, a visibility of a display screen is very high, so it can be seen that Sample 2 has a high visibility of the display screen implemented in the display panel (shown as 110 of FIG. 1).

In other words, in the display device (shown as 100 of FIG. 1) according to the aspect of the present disclosure, by locating the cover window 200 having the density control area D in the transmission direction of the emitted light, the external light reflectance is less than 2%. Thus, it is possible to improve a visibility in the outdoors by minimizing the reflectance to the external light while protecting the display panel (shown as 110 in FIG. 1) from an external impact.

In particular, by lowering the reflectance to the external light as described above, the contrast ratio of the display device (shown as 100 of FIG. 1) according to the aspect of the present disclosure is also improved.

In other words, generally, a display device such as the display device (100 of FIG. 1) of this aspect may have a high contrast ratio for a visible light. Here, the contrast ratio may be implemented through a following equation 1.

$$\text{Contrast ratio (in dark room)} = \text{a luminance of white light/a luminance of black light.} \qquad \text{Equation 1}$$

However, when a reflected light is output together with emitted white light and black light under a bright room condition, the above equation is slightly varied. In other words, since the reflected light is reflected to the same degree regardless of the white light and the black light, each of a luminance of the white light and a luminance of the black light increases as much as a luminance of the reflected light, and thus the contrast ratio may be expressed by a following equation 2.

$$\text{Contrast ratio (in bright room)} = \text{(a luminance of white light+a luminance of reflected light)/(a luminance of black light+a luminance of reflected light).} \qquad \text{Equation 2}$$

Since the luminance of the white light is higher than that of the black light, the contrast ratio according to the equation 1 generally has a value greater than 1. Under this condition, when the luminance of the reflected light is added to the numerator and the denominator, the contrast ratio is reduced.

Here, since there is an advantage that a clearer screen can be obtained as the contrast ratio is higher, the contrast ratio as high as possible may be maintained when other conditions are fixed.

In particular, as described above, since the contrast ratio in the bright room condition is lower than that in the dark room condition, it is necessary to increase the contrast ratio in the bright room condition. In this regard, in the display device (shown as 100 of FIG. 1) according to the aspect of the present disclosure, by minimizing the luminance of the reflected light by the external light coming from the outside, the contrast ratio can be maximized without reducing the luminance of the light output from the display panel (shown as 110 of FIG. 1).

Here, for example, the voids 210 of the density control area D provided in the cover window 200 according to the aspect of the present disclosure have a particle diameter (or particle size) of several to several hundreds of nanometers, and the particle size may be equal to or less than 400 nanometers, which is a practical lower limit of a visible light wavelength band.

As described above, by making the voids 210 of the density control area D of the cover window 200 to have a nano size, the cover window 200 can lower only the reflectance due to the external light while maintaining a transparency.

In addition, by forming the particle diameter of the voids 210 to be equal to or less than the visible light wavelength, a scattering of a visible light can be prevented, and the transmittance of light is not reduced.

In addition, it is preferable that a depth h of the density control area D of the cover window 200 according to the aspect of the present disclosure has a range of 50 to 800 nm. When the depth h of the density control area D is 50 nm or less, it may not be sufficient to serve as the density control area D, so it may have no effect on an improvement of external light reflectance. When the depth h of the density control area D is 800 nm or more, the size and number of the voids 210 per unit area at the surface of the cover window 200 gradually increase, so a rigidity of the surface of the density control area D may be reduced. Therefore, the depth h of the density control area D of the cover window 200 is preferably designed to satisfy 50 to 800 nm.

Since a reflectance and a transmittance are in inverse proportion to each other, the transmittance of the cover window 200 is improved by lowering the reflectance for the external light. Accordingly, the luminance implemented in the R, G and B sub-pixels (R-SP, G-SP and B-SP of FIG. 1) of the display panel (designated as 110 in FIG. 1) is further improved.

FIGS. 3A and 3B are photographs measuring the visibility of the display device (shown as 100 of FIG. 1) according to the presence or absence of the density control area D of the cover window 200. FIG. 3A shows a display device including a conventional cover glass, and FIG. 3B shows the display device (shown as 100 of FIG. 1) including the cover glass 200 provided with the density control area D according to the aspect of the present disclosure.

FIGS. 3A and 3B are photographs measuring a visibility by a reflectance of an external light in a driving state, and incident azimuth and illuminance of the external light are designed and measured in the same way.

It can be seen that a visibility of a driving image implemented in the display device (shown as 100 of FIG. 1) of FIG. 3B is improved compared to the display device including a cover window made of a typical glass substrate of FIG. 3A.

In addition, it can be seen that the driving image is clearer in FIG. 3B as in FIG. 3A, and this is because the transmittance of the cover window 200 according to the aspect of the present disclosure is high and there is no separate haze phenomenon.

Accordingly, it can be seen that the cover window 200 according to the aspect of the present disclosure is completely different from the typical anti-glare (AG) type and anti-reflection (AR) type anti-reflection films.

In other words, in the case of the AG type anti-reflection film, a separate surface treatment layer is further included, so that it has a certain amount of haze property, and thus an image quality is deteriorated. However, as the cover window 200 according to the aspect of the present disclosure is provided with the density control area D at the surface of the cover window itself, it has a difference in configuration from the AG type anti-reflection film including the separate surface treatment layer, and in particular, the cover window 200 of the aspect of the present disclosure has a difference in that it does not have a separate haze component.

In addition, in the case of the AR type anti-reflection film, as a reflectance of an external light is lowered through destructive interference of light, it has a stacked structure of several layers having different refractive indices. However, as the cover window 200 according to the aspect of the present disclosure prevents the external light from being reflected through the density control area D of the surface of the cover window 200 itself, it has a clear difference in processing the reflected light from the AR type anti-reflection film and also has a difference in configuration.

In particular, since the AG type and AR type anti-reflection films block the amount of light emitted from the light emitting layer (shown as 113 of FIG. 5) by about 50%, a high consumption is required to provide desired luminance. However, in the display device (shown as 100 of FIG. 1) according to the aspect of the present disclosure, a luminance decrease due to the cover window 200 does not occur, and thus the light emitted from the light emitting layer (shown as 113 of FIG. 5) is not reduced. Therefore, a high luminance image can be provided with the same power, and a power consumption for providing an image with the same luminance can also be reduced.

As described above, in the display device (shown as 100 of FIG. 1) according to the aspect of the present disclosure, the cover window 200 having the density control area D is positioned to correspond to the transmission direction of the light emitted through the light emitting layer (shown as 113 of FIG. 5), and thus the reflectance of the external light can be lowered, thereby improving a visibility in the outdoors.

In addition, it is possible to prevent a problem in that the luminance and the contrast ratio are reduced due to the external light and the display characteristics is thus deteriorated.

In addition, by forming the particle diameter of the voids 210 provided in the density control area D to several to several hundreds of nanometers to be below the visible light wavelength, the cover window 200 prevents a scattering of a visible light to maintain transparency while lowering only reflectance due to the external light.

FIGS. 4A to 4D are cross-sectional views illustrating steps of forming a density control area of a cover window according to an aspect of the present disclosure.

Figure 4A:
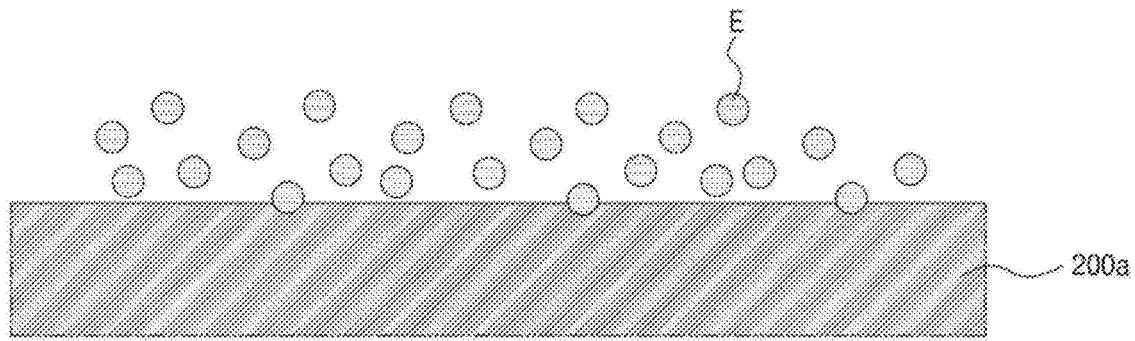
FIGS. 4A to 4D are cross-sectional views illustrating steps of forming a density control area of a cover window according to an aspect of the present disclosure.

As shown in FIG. 4A, a glass substrate 200a is prepared. The glass substrate 200a may be made of one of sapphire glass, tempered glass and soda lime glass substrate.

An etchant E is applied to a surface of the glass substrate 200a.

The etchant E may be composed of at least one of a fluorine-based compound, an additive and an inorganic acid. The fluorine-based compound may be one or more selected from hydrogen fluoride (HF), ammonium fluoride ($NH_4F$) and acid ammonium fluoride ($NH_4HF_2$), and the additive may include a fluorine-based surfactant or an anionic surfactant.

When the surfactant is added, a penetration power of the etchant E can be increased, and problems such as stains caused by deposits generated during etching adhering to the surface of the glass substrate 200a are prevented, thereby maintaining a very clean surface state.

The inorganic acid may be one or more selected from sulfuric acid ($H_2SO_4$), phosphoric acid ($H_3PO_4$), hydrogen chloride (HCl), carbonic acid ($H_2CO_3$), nitric acid ($HNO_3$) and perchloric acid ($HClO_4$).

The inorganic acid as an auxiliary material may combine with cations of the glass component to form a water-soluble sludge to prevent a re-adhesion of sludge on the surface of the glass substrate 200a, may increase an oxidizing power of the etchant E to improve an etching power, and may increase a viscosity of the etchant E to prevent dents and scratch expansion to improve a surface state of the glass substrate 200a.

Figure 4B:
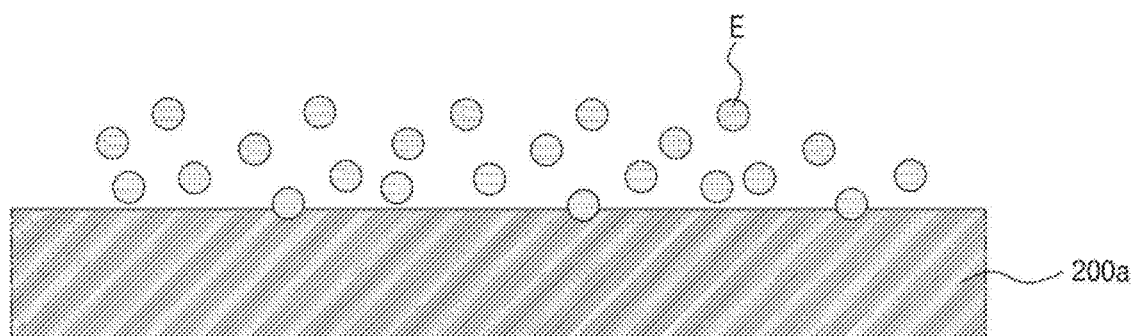

As such, by applying the etchant E on the glass substrate 200a, a network of Si—O—Si, which is a glass component constituting the glass substrate 200a, is broken, as shown in FIG. 4B.

Atoms in the glass constituting the glass substrate 200a form an extended three-dimensional network, and the cations in the glass are divided into three groups: (1) network formers (Si, Zr and B), (2) network modifiers (Na and Ca), and (3) intermediates (Al and Mg).

This glass is subjected to reactions of (1) hydration and hydrolysis, (2) ion exchange and (3) network reorganization by the etchant E.

Water molecules may essentially react with the surface of the glass through a hydrolysis reaction coupled with a reverse condensation reaction, as represented by a chemical formula 1.

The hydrolysis reaction may be accompanied by a network decomposition (referring to a chemical formula 2) to form an aqueous solution such as Si(OH) 4.

$$Si—O—Si + H_2O \leftrightarrow Si—O + OH—Si. \qquad \text{[Chemical formula 1]}$$

$$Si—O—Si(OH)_3 + OH^- \rightarrow Si—O + Si(OH)_4^- \rightarrow Si—O^- + Si(OH)_4. \qquad \text{[Chemical formula 2]}$$

Here, the network decomposition reaction plays an important role due to a high concentration of OH". As the ion exchange is an exchange of glass modifier cations ($Na^+$, $K^+$, $Ca^{2+}$ and $Mg^{2+}$) with protons, the protons originate from water molecules in a form of $H_2O$ and/or $H_3O^+$, as shown in a chemical formula 3 and a chemical formula 4.

$$Si—OR + H_3O + \rightarrow Si—OH + R^+ + H_2O. \qquad \text{[Chemical formula 3]}$$

$$Si—OR + H_3O + \rightarrow Si—OH + R^+ + OH^-. \qquad \text{[Chemical formula 4]}$$

Silanol groups (Si—OH) generated through the ion exchange may be condensed into the Si—O—Si network by a dehydration, as shown by the reverse reaction of the chemical formula 1.

This reorganizes the glass surface to form a porous material similar to an aggregation of colloidal silica particles, which is called the network reorganization.

Figure 4C:
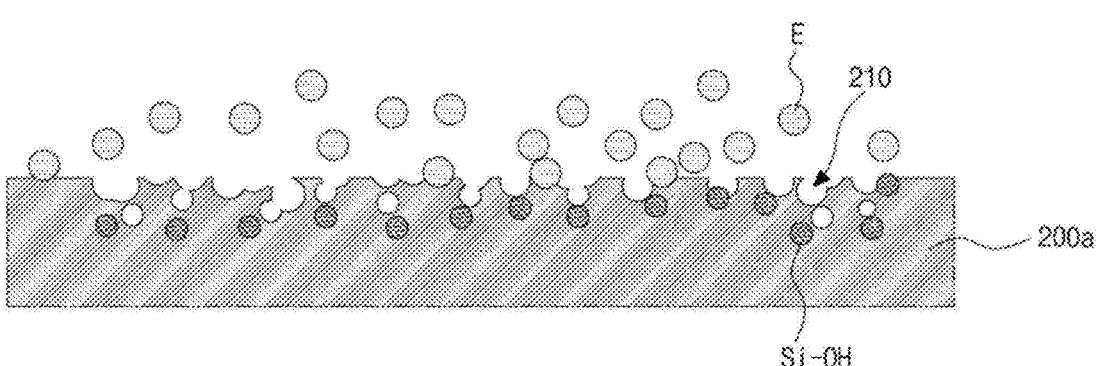

In other words, the glass substrate 200a according to the aspect of the present disclosure is network-reorganized through the ion exchange reaction of the silanol groups (Si—OH) by the etchant E. At this time, as shown in FIG. 4C, the voids 210 are formed in the glass substrate 200a so that the silanol groups (Si—OH) can penetrate into the glass.

Figure 4D:
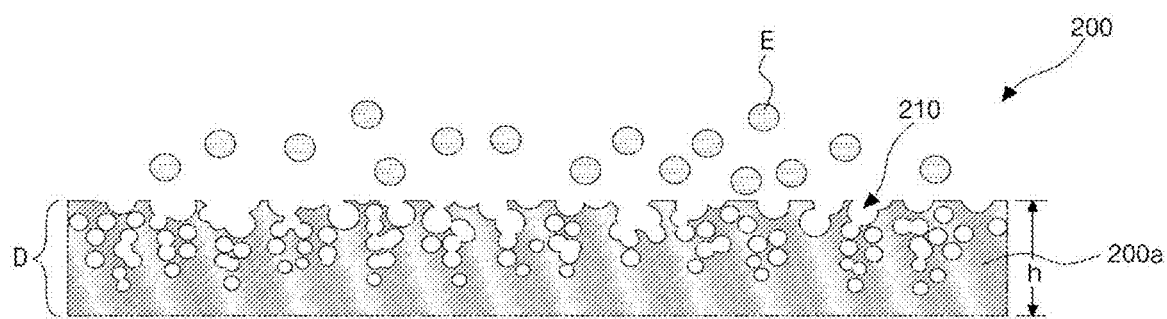

By this ion exchange reaction, the silanol groups (Si—OH) continue to dig into the glass substrate 200a, and as shown in FIG. 4D, the cover window 200 according to the aspect of the present disclosure has the density control area D in which the voids 210 are formed at the predetermined depth h.

At this time, as the ion exchange reaction occurs preferentially at the surface of the glass substrate 200a, the voids 210 are formed to decrease in size and number per unit area from the top surface to the bottom surface of the cover window 200.

In addition, by adjusting an exposure time of the etchant E, the size and number of voids 210 per unit area of the density control area D can be adjusted to some extent. Thus, the cover window 200 according to the aspect of the present disclosure can be formed such that the voids 210 of the density control area D have the particle diameter of several to several hundreds of nanometers equal to or less than 400 nm, and can also be formed such that the density control area D have the depth h of 50 to 800 nm.

The cover window 200 according to this aspect of the present disclosure includes the glass modifier cations ($Na^+$, $K^+$, $Ca^{2+}$ and $Mg^{2+}$) as a whole, and in this case, the glass modifier cations ($Na^+$, $K^+$, $Ca^{2+}$ and $Mg^{2+}$) are ion-exchanged with the silanol groups (Si—OH) only in the density control area D. Accordingly, in the density control area D, alkali metals and alkaline earth metals, which are the glass modifier cations ($Na^+$, $K^+$, $Ca^{2+}$ and $Mg^{2+}$), are removed.

Meanwhile, in the display device (shown as 100 of FIG. 1) according to the aspect of the present disclosure, the cover window 200 provided with the density control area D is positioned corresponding to the transmission direction of a light emitted through the light emitting layer (shown as 113 of FIG. 5), and thus the reflectance of the external light can be lowered. However, as the transmittance of the cover window 200 is improved, the external light passes through the cover window 200 and is incident into the display panel (shown as 110 of FIG. 1) of the display device (shown as 100 of FIG. 1).

FIG. 5 is a cross-sectional view, taken along line II-II' of FIG. 1, illustrating a structure of a unit pixel including three sub-pixels of an OLED according to an aspect of the present disclosure.

As shown in FIG. 5, one unit pixel P may include red, green and blue sub-pixels R-SP, G-SP and B-SP, and each of the sub-pixels R-SP and G-SP and B-SP may include an emission area EA, and a bank 119 may be disposed along an edge of the emission area EA to form a non-emission area NEA.

At this time, the semiconductor layer 103 may be positioned on the switching area TrA of the non-emission area NEA of each of the sub-pixels R-SP, G-SP, and B-SP on the substrate 101. The semiconductor layer 103 may be made of silicon, and may include an active region 103a constituting a channel at a center portion thereof, and source and drain regions 103b and 103c doped with a high concentration of impurities on both sides of the active region 103a.

A gate insulating layer 105 may be positioned on the semiconductor layer 103.

A gate electrode DG corresponding to the active region 103a of the semiconductor layer 103 and a gate line GL extending in one direction may be provided on the gate insulating layer 105.

In addition, a first inter-layered insulating layer 109a may be positioned on the gate electrode DG and the gate line GL, and in this case, the first inter-layered insulating layer 109a and the gate insulating layer 105 therebelow may include first and second semiconductor layer contact holes 116 respectively exposing the source and drain regions 103b and 103c which are located on both sides of the active region 103a.

On the first inter-layered insulating layer 109a including the first and second semiconductor layer contact holes 116, source and drain electrodes DS and DD spaced apart from each other and respectively contacting the source and drain regions 103b and 103c exposed through the first and second semiconductor layer contact holes 116 may be provided.

A second inter-layered insulating layer 109b may be positioned on the source and drain electrodes DS and DD and the first inter-layered insulating layer 109a exposed between the two electrodes DS and DD.

In this case, the source and drain electrodes DS and DD, the semiconductor layer 103 including the source and drain regions 103b and 103c in contact with the source and drain electrodes DS and DD, and the gate insulating layer 105 and the gate electrode DG positioned on the semiconductor layer 103 may form a driving thin film transistor DTr.

Meanwhile, the switching thin film transistor (STr of FIG. 1B) may have the same structure as the driving thin film transistor DTr and may be connected to the driving thin film transistor DTr.

In addition, in the drawing, the driving thin film transistor DTr as a top gate type transistor in which the semiconductor layer 103 is made of a polysilicon semiconductor layer or an oxide semiconductor layer is shown as an example, and as a modification thereof, may be configured as a bottom gate type transistor formed of pure and impurity amorphous silicon.

In this case, when the semiconductor layer 103 is made of an oxide semiconductor layer, a light blocking layer (not shown) may be further positioned below the semiconductor layer 103, and a buffer layer (not shown) may be disposed between the light blocking layer (not shown) and the semiconductor layer 103.

The second inter-layered insulating layer 109b may include a drain contact hole PH exposing the drain electrode DD of the driving thin film transistor DTr. A first electrode 111 may be located on the second inter-layered insulating layer 109b, may be connected to the drain electrode DD of the driving thin film transistor DTr through the drain contact hole PH, and may form an anode of the light emitting diode ED made of, for example, a material having a relatively high work function value.

The first electrode 111 may be positioned for each of the sub-pixels R-SP, G-SP and B-SP, and the bank 119 may be positioned between the first electrodes 111 of the sub-pixels R-SP, G-SP and B-SP. In other words, the first electrodes 111 may have a separate structure for each of the sub-pixels R-SP, G-SP and B-SP with the bank 119 as a boundary for each of the sub-pixels R-SP, G-SP and B-SP.

In addition, the light emitting layer 113 may be positioned on the first electrode. The light emitting layer 113 may include a single layer made of a light emitting material, and a hole injection layer to increase light emitting efficiency. In order to increase an emission efficiency the light emitting layer includes multiple layers of a hole injection layer, a hole transport layer, an emitting material layer, an electron transport layer and an electron injection layer.

In the display device 100 according to the aspect of the present disclosure, the same white light may be emitted from the light emitting layer 113 of each of the sub-pixels R-SP, G-SP, and B-SP.

A second electrode 115 forming a cathode may be positioned on the entire surface of the light emitting layer 113. The second electrode 115 may be made of, for example, a material having a relatively small work function value.

In the display device 100, when predetermined voltages are applied to the first electrode 111 and the second electrode 115 according to a selected signal, holes injected from the first electrode 111 and electrons provided from the second electrode 115 are transported to the light emitting layer 113 to form excitons, and when the excitons are transitioned from an excited state to a ground state, a light is generated and emitted in a form of a visible light.

Here, the display device 100 according to the aspect of the present disclosure may be a top emission type display device, in which a white light emitted from the light emitting layer 113 passes through the second electrode 115 and goes out to the outside, and finally, the display device 100 implements an arbitrary image.

In the top emission type display device, the switching and driving thin film transistors (shown as STr and DTr of FIG. 1) can be widely provided below the bank 119 and the first electrode 111. Accordingly, compared to a bottom emission type display device, there is an advantage in that a design area of the thin film transistor (shown as STr and DTr of FIG. 1) is wide.

In this case, the first electrode 111 as the anode may be formed of a metal material having a high reflectance such as aluminum (Al) or a stacked structure of aluminum (Al) and ITO, and the second electrode 115 as the cathode may be formed of a transparent metal material such as ITO or IZO, or a semi-transparent metal material such as magnesium (Mg) or silver (Ag) so that each of red light, green light and blue light emitted from the light emitting layers 113 can be transmitted.

A passivation layer 102 in a form of a thin film and an encapsulation substrate 140 may be sequentially positioned on the thin film transistors (shown as STr and DTr of FIG. 1) and the light emitting diode ED. The passivation layer 102 may serve to protect the light emitting layer 113 vulnerable to an external moisture or oxygen by preventing penetration of a moisture into each of the sub-pixels R-SP, G-SP and B-SP.

In addition, the passivation layer 102 may serve to protect the thin film transistors (STr and DTr of FIG. 1) and the light emitting diode ED from an external impact, and the passivation layer 102 may also serve to bond the substrate 101 and the encapsulation substrate 140.

Accordingly, the display device 100 is encapsulated.

At this time, a color conversion layer 106 may be positioned at an inner side (or inner surface) of the encapsulation substrate 140, and the color conversion layer 106 may include color filter patterns R-CF, G-CF and B-CF located corresponding to the R, G and B sub-pixels R-SP, G-SP and B-SP.

The color conversion layer 106 is for converting a color of a white light emitted from the light emitting layer 113. A red color filter pattern R-CF, a green color filter pattern G-CF and a blue color filter pattern B-CF may be positioned to correspond to the emission areas EA of the R, G and B sub-pixel R-SP, G-SP and B-SP, respectively.

Accordingly, the display device 100 according to the aspect of the present disclosure emits R, G and B colors for the respective sub-pixels R-SP, G-SP and B-SP to realize a full color with a high luminance.

The cover window 200 may be positioned on an outer side (or outer surface) of the encapsulation substrate 140. Between the encapsulation substrate 140 and the cover window 200, a touch sensor 120 and a polarizing plate 130 may be sequentially positioned from the encapsulation substrate 140.

Here, as the cover window 200 according to the aspect of the present disclosure includes the density control area D that causes a change in refractive index according to a gradual change in density, it is possible to lower an external light reflectance, thereby improving a visibility in the outdoors.

In addition, it is possible to prevent a problem in that the luminance and the contrast ratio are reduced due to the external light and the display characteristics is deteriorated.

In addition, the touch sensor 120 positioned outside the encapsulation substrate 140 may include a plurality of touch sensing lines (not shown), and a plurality of touch driving lines (not shown) that are formed to cross the touch sensing lines without being in contact with the touch sensing line.

The touch sensor 120 may detect a change in capacitance generated at a portion, where the touch sensing line and the touch driving line cross each other with an insulating layer (not shown) interposed therebetween, to determine whether the crossing portion is touched.

The polarizing plate 130 may be positioned on the touch sensor 120 i.e., between the cover window 200 and the touch sensor 120. The polarizing plate 130 transmits only a light that vibrates in the same direction as a polarization axis thereof among a light directed to the polarizing plate 130, and absorbs or reflects a light, which vibrates in other directions, using a suitable medium, thereby generating a light vibrating in a specific direction.

The polarizing plate 130 serves to prevent a problem in that a visibility is deteriorated due to an increase in reflectance by the light emitting layer 113 and various lines or electrodes, and the lines or electrode patterns are visually recognized.

In particular, in the display device 100 according to the aspect of the present disclosure, as the density control area D is provided at the surface of the cover window 200, the boundary between the cover glass 200 and the air layer becomes optically ambiguous, and thus the incident light incident from the outside is not totally reflected due to a difference in refractive index between the two media but is incident into the display device 100 as it is. In this case, the incident light incident into the display device 100 by the density control area D of the cover window 200 is partially absorbed by the polarizing plate 130, and as a result, the display device 100 can serve to prevent the incident light from being transmitted to the outside again.

As described above, in the display device 100 according to the aspect of the present disclosure, by positioning the cover glass 200 provided with the density control area D that causes a change in refractive index according to a gradual change in density corresponding to the transmission direction of a light emitted through the light emitting layer 113, the external light reflectance can be lowered, and a visibility can be improved.

In addition, it is possible to prevent a problem in that the luminance and the contrast ratio are reduced due to the external light and the display characteristics is deteriorated.

In addition, by forming the particle diameter of the voids (shown as 210 of FIG. 4D) provided in the density control area D to several to several hundreds of nanometers to be below the visible light wavelength, the cover window 200 prevents scattering of a visible light to maintain transparency while lowering only the reflectance for the external light.

In particular, since the density control area D is formed by adjusting the density of the cover window 200 itself, it does not need to include a separate surface treatment layer, thereby improving an efficiency of process.

It will be apparent to those skilled in the art that various modifications and variation can be made in the present disclosure without departing from the spirit or scope of the disclosure. Thus, it is intended that the present disclosure cover the modifications and variations of this disclosure provided they come within the scope of the appended claims and their equivalents.

What is claimed is:

1. A display device, comprising:
   a display panel; and
   a cover window including a density control area and located corresponding to a transmission direction of light emitted from the display panel,
   wherein a refractive index of the density control area is gradually changed through a plurality of voids disposed in the density control area,
   wherein the density control area comprises:
      an upper region comprising a top surface of the cover window and comprising a first plurality of voids among the plurality of voids,
      a middle region disposed below the upper region and comprising a second plurality of voids among the plurality of voids, and
      a lower region disposed below the middle region and comprising a third plurality of voids among the plurality of voids,
      wherein the refractive index of the density control area gradually increases from the upper region to the lower region of the density control area,
   wherein the upper region, the middle region, and the lower region are monolithic, and

wherein one of the first plurality of voids and one of the second plurality of voids, which are located at an interface between the upper region and the middle region, are combined to form a void.

2. The display device of claim 1, wherein the density control area is located adjacent to the top surface of the cover window opposite to a bottom surface of the cover window facing the display panel.

3. The display device of claim 2, wherein the plurality of voids decrease in size or number per unit area from the upper region to the lower region of the density control area.

4. The display device of claim 3, wherein a top side of the density control area in the upper region of the density control area has a first density, and a difference between a refractive index of the top surface of the density control area and a refractive index of an air layer located outside the cover window is equal to or less than a first predetermined threshold.

5. The display device of claim 4, wherein a lower side of the density control area in the lower region of the density control area has a second density greater than the first density, and a difference between a refractive index of the bottom surface of the density control area and a refractive index of a glass forming the cover window is equal to or less than a second predetermined threshold.

6. The display device of claim 1, wherein the plurality of voids has a particle diameter of 400 nm or less.

7. The display device of claim 1, wherein the density control area has a depth of 50 nm to 800 nm.

8. The display device of claim 1, wherein glass modifier cations of the density control area are removed in the cover window.

9. The display device of claim 8, wherein the glass modifier cations include alkali metals and alkaline earth metals.

10. The display device of claim 1, wherein one of the second plurality of voids and one of the third plurality of voids, which are located at an interface between the middle region and the lower region, are combined to form a void.

11. A display device, comprising:
a display panel; and
a cover window including a density control area and located on an image displaying surface of the display panel,
a plurality of voids provided in the density control area, so that a refractive index of the density control area gradually changes from a first refractive index to a second refractive index, from a first side of the density control area to a second side of the density control area opposite to the first side, the first side is a side of the density control area that is in contact with a medium surrounding the display device,
wherein a difference between the first refractive index and a refractive index of a material constituting the cover window is less than or equal to a first predetermined threshold,
wherein a difference between the second refractive index and a refractive index of the medium is less than or equal to a second predetermined threshold,
wherein the density control area comprises:
an upper region comprising the first side of the density control area and comprising a first plurality of voids among the plurality of voids,
a middle region disposed below the upper region and comprising a second plurality of voids among the plurality of voids,
a lower region disposed below the middle region and comprising the second side of the density control area, the lower region comprising a third plurality of voids among the plurality of voids,
wherein the refractive index of the density control area gradually increases from the upper region to the lower region of the density control area,
wherein a size of the second plurality of voids is greater than a size of the third plurality of voids, and the size of the second plurality of voids is smaller than a size of the first plurality of voids.

12. The display device of claim 11, wherein the medium includes air.

13. The display device of claim 11, wherein the upper region, the middle region, and the lower region are monolithic, and
wherein one of the first plurality of voids and one of the second plurality of voids, which are located at an interface between the upper region and the middle region, are combined to form a void.

14. The display device of claim 13, wherein one of the second plurality of voids and one of the third plurality of voids, which are located at an interface between the middle region and the lower region, are combined to form a void.

* * * * *